(12) United States Patent
Fukui et al.

(10) Patent No.: US 6,253,351 B1
(45) Date of Patent: Jun. 26, 2001

(54) CIRCUIT OPTIMIZATION SYSTEM

(75) Inventors: Masahiro Fukui; Masakazu Tanaka, both of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/273,909

(22) Filed: Mar. 22, 1999

(30) Foreign Application Priority Data

Mar. 24, 1998 (JP) .................................................. 10-075863

(51) Int. Cl.$^7$ ........................................................ G06F 17/50
(52) U.S. Cl. ............................................... 716/2; 716/3
(58) Field of Search .............................................. 716/2, 3

(56) References Cited

U.S. PATENT DOCUMENTS

| | | | |
|---|---|---|---|
| 4,937,755 | * | 6/1990 | Yokota et al. ............................ 716/3 |
| 5,363,313 | * | 11/1994 | Lee ........................................... 716/2 |
| 5,903,470 | * | 5/1999 | Miyoshi et al. ......................... 716/2 |

FOREIGN PATENT DOCUMENTS

| | | | |
|---|---|---|---|
| 05274390 | 10/1993 | (JP) | ............................... G06F/15/60 |
| 10003491 | 1/1998 | (JP) | ............................... G06F/17/50 |
| 11-3973 | 1/1999 | (JP) . | |

* cited by examiner

*Primary Examiner*—Trong Phan
(74) *Attorney, Agent, or Firm*—Harness, Dickey & Pierce, P.L.C.

(57) ABSTRACT

An equivalent circuit converter reads out transistor-level circuit diagram data and equivalency conversion rule data, converts circuit data based on the equivalency conversion rule data, and then feeds back the converted circuit data to the circuit diagram data. An estimate calculator reads out the circuit diagram data, which has been converted by the equivalent circuit converter, and environmental variable data, thereby calculating an estimate representing a degree of optimization. In response to the estimates supplied from the estimate calculator, a circuit optimizer selects partial circuits to be subjected to equivalent circuit conversion during the optimization of the circuit. Then, the circuit optimizer sequentially determines whether or not each of the partial circuits should be converted into an associated equivalent circuit, thereby optimizing the entire circuit.

8 Claims, 13 Drawing Sheets

FIG. 11

```
knowledge{
    structure A is equivalent to B ;
    structure A is equivalent to C ;
                    .
                    .
                    .
}
```

CIRCUIT OPTIMIZATION SYSTEM

BACKGROUND OF THE INVENTION

The present invention relates to a circuit optimization system for synthesizing a circuit like CMOS or LSI on the level of individual transistors in designing the circuit.

Thanks to recent marvelous development in semiconductor device manufacturing technologies, a so-called "system-on-chip" is now prevailing in the art. That is to say, various functions of an overall system, like computer or telecommunication unit, can be incorporated into a single-chip semiconductor integrated circuit. Also, semiconductor device manufacturing technologies have lately been alternating their generations one after another at even shorter intervals than what they used to be. As a result, it has become a lot easier and much preferred to implement a system-on-chip using such downsized components. Moreover, a semiconductor chip now has to meet a multiplicity of requirements, like low power dissipation, high performance and cost reduction, either selectively or simultaneously, depending on the applications and the operating conditions of specific systems. Accordingly, in order to cope with such a wide variety of demands, multiple sets of techniques should be prepared beforehand in manufacturing a semiconductor integrated circuit.

If the number of variant semiconductor device manufacturing processes or the size of an overall system is increased, then the number of processing steps should also be increased in designing a semiconductor system. Thus, designing techniques should be innovated to reduce such an increased number of designing process steps. According to a most promising measure to reduce the number of designing process steps, circuits having an equivalent function are utilized as recyclable components irrespective of a specific semiconductor device manufacturing process.

Such recyclable functional circuits or layout components are called "hard IP's". In order to recycle these hard IP's, a variety of techniques, including layout compaction and layout synthesis, may be employed. In accordance with a layout compaction technique, the layout can be automatically modified if the design rule employed in a semiconductor device manufacturing process is changed, as disclosed in Japanese Laid-Open Publication No. 10-3491, for example. On the other hand, in accordance with a layout synthesis technique, various types of layouts are represented by respective parameters associated with individual design rules. Furthermore, if a semiconductor device manufacturing process is modified, then an optimum size of a transistor changes correspondingly. Thus, a method of combining a transistor sizing technique (see, for example, Japanese Laid-Open Publication No. 11-3973) with a layout compaction technique has also been proposed.

However, in accordance with conventional techniques for recycling hard IP's, the structure of a circuit cannot be changed. Accordingly, if a circuit structure to be recycled does not fit in with new conditions imposed by updated process technologies, then the circuit is no longer optimal.

SUMMARY OF THE INVENTION

An object of the present invention is providing a system that can cope with any modification in manufacturing conditions or operating environment by automatically converting a circuit in question into an alternate circuit optimized to comply with that modified conditions or environment.

In order to achieve this object, according to the present invention, if process technology has been modified, then equivalency conversion is carried out while changing part of a circuit once synthesized (hereinafter, simply referred to as a "partial circuit") to optimize the data of the circuit.

A first circuit optimization system according to the present invention is adapted to optimize a transistor-level circuit, consisting of a plurality of partial circuits each including a plurality of transistors, to comply with process technology associated with the circuit. The system includes equivalent circuit converting means for provisionally converting at least one of the partial circuits, which complies with an equivalency conversion rule of the circuit, into an equivalent circuit having a function equivalent to that of the partial circuit. The system also includes estimate calculating means for calculating an estimate representing a degree of compatibility of the equivalent circuit with the process technology. And the system further includes circuit optimizing means for evaluating the estimate, derived by the calculating means, and for deciding that the partial circuit should be converted into the equivalent circuit if the estimate has improved.

In the first circuit optimization system, if the estimate derived has improved from what it used to be before the conversion, the equivalent circuit can be adopted for circuit synthesis. Accordingly, even if process technology has been modified, circuit data, meeting the requirements of the new process technology, can be re-synthesized.

In one embodiment of the present invention, the converting means preferably includes: an identifier for identifying at least one partial circuit, which is convertible into an associated equivalent circuit thereof, from the partial circuits; and a converter for converting the partial circuit, which has been identified as convertible by the identifier, into the associated equivalent circuit thereof.

In such an embodiment, even if the data about the transistor-level circuit has an enormous quantity, a target partial circuit, complying with the equivalency conversion rule of the circuit, can be identified and converted with much more certainty.

A second circuit optimization system according to the present invention is also adapted to optimize a transistor5 level circuit consisting of a plurality of partial circuits each including a plurality of transistors. The system includes circuit optimization means for optimizing the circuit by converting each of these partial circuits into an associated equivalent circuit thereof having a function equivalent to that of the partial circuit in accordance with an equivalency conversion rule of the circuit.

In the second circuit optimization system, if an equivalency conversion rule, complying with the process technology, has been selected, circuit data can be optimized quickly and easily to comply with the process technology.

A third circuit optimization system according to the present invention is also adapted to optimize a transistor-level circuit to comply with process technology associated with the circuit. The system includes circuit editing means, provided with an input/output section, for interactively modifying the circuit in accordance with an equivalency conversion rule of the circuit. The system also includes estimate calculating means for calculating an estimate to optimize the circuit modified by the circuit editing means in accordance with the process technology. And the system further includes display means for displaying the estimate derived by the calculating means thereon.

In the third circuit optimization system, an operator of the system can interactively modify the circuit using the circuit editing means and can calculate an estimate for optimizing the equivalent circuit obtained by modifying the circuit using the circuit editing means based on the equivalency conversion rule thereof. And then, the operator can output the estimate to the output of the circuit editing means. Accordingly, since the operator can check the estimate of the equivalent circuit just after the modification, artificial errors of the operator can be prevented with a lot more certainty. As a result, the work efficiency can be improved in manually optimizing circuit synthesis.

In an exemplary embodiment of the first or third circuit optimization system, the calculating means preferably includes: a threshold-to-power ratio calculator; a delay calculator; a logical threshold voltage calculator; and an estimate calculator. The threshold-to-power ratio calculator calculates a ratio of the sum of respective threshold voltages of a plurality of serially connected transistors, included in a partial circuit, to a power supply voltage. The delay calculator calculates a delay time of the partial circuit. The logical threshold voltage calculator calculates a logical threshold voltage, which is a voltage when output logical states are inverted at a gate. And the estimate calculator calculates the estimate by weighting respective results derived by the threshold-to-power ratio calculator, delay calculator and logical threshold voltage calculator in accordance with the process technology.

In such an embodiment, some parameters of the process technology: namely, power supply voltage, threshold voltages of transistors, variations during a process and logical threshold voltages, can be reflected on the estimate for optimizing a circuit. Accordingly, the circuit can be optimized on the level of individual transistors.

In another exemplary embodiment of the first or third circuit optimization system, the calculating means preferably further includes a transistor width optimizer for optimizing the widths of a plurality of transistors and outputting the optimized transistor widths to the delay calculator and the logical threshold voltage calculator.

In such an embodiment, the precision of estimated delay time and logical threshold voltage can be improved.

BRIEF DESCRIPTION OF THE DRAWINGS

FIG. 11 illustrates an exemplary program describing an equivalency conversion relationship among circuits A, B and C as knowledge representations in the circuit optimization system of the first embodiment.

DESCRIPTION OF THE PREFERRED EMBODIMENTS

Embodiment 1

Hereinafter, the first embodiment of the present invention will be described with reference to the accompanying drawings.

Figure 1:
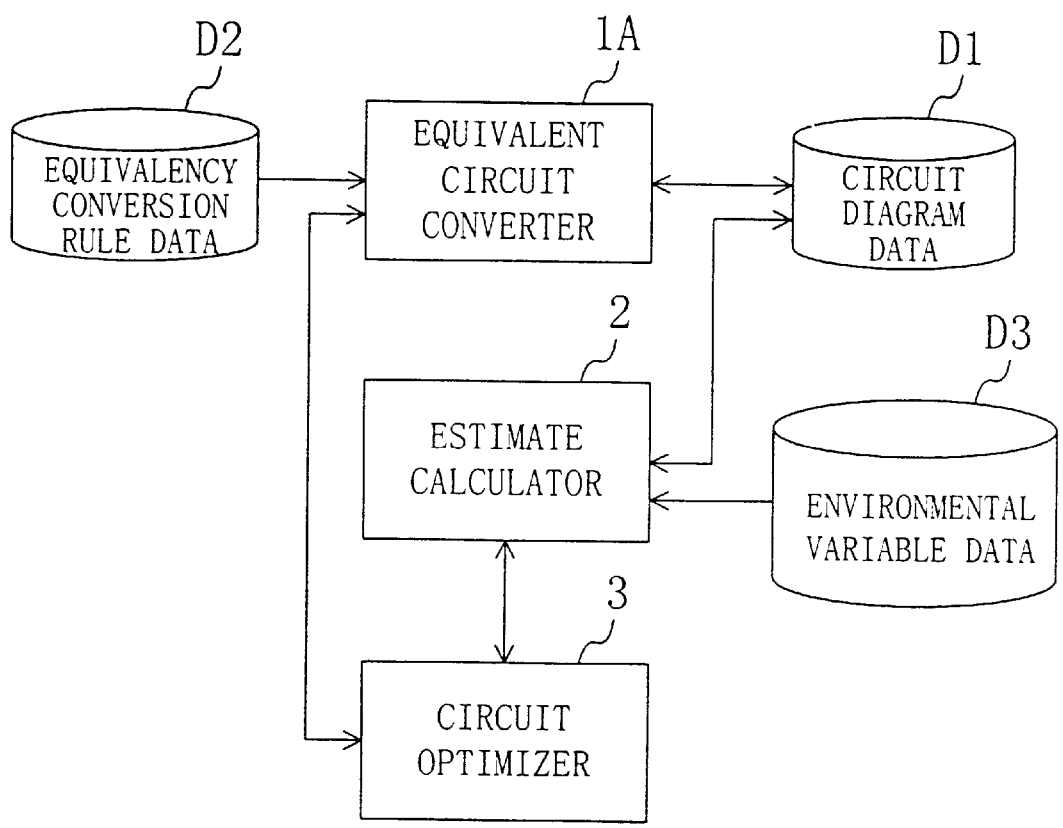
FIG. 1 is a functional block diagram of a circuit optimization system according to the first embodiment of the present invention.

FIG. 1 illustrates functional blocks of a circuit optimization system according to the first embodiment of the present invention. As shown in FIG. 1, the circuit optimization system of the first embodiment includes: an equivalent circuit converter 1A; an estimate calculator 2; and a circuit optimizer 3.

The equivalent circuit converter 1A is supplied with not only circuit diagram data D1 about a partial circuit to be synthesized, including transistors, resistors and capacitors, but also equivalency conversion rule data D2 defined about the partial circuit. In response thereto, the converter 1A converts the circuit diagram data D1 based on the equivalency conversion rule data D2 and then feeds back the converted data to the circuit diagram data D1.

The estimate calculator 2 is supplied with not only the circuit diagram data D1 converted by the equivalent circuit converter 1A, but also environmental variable data D3 representing the process technology in terms of process conditions, power supply voltage and so on. In response thereto, the calculator 2 calculates an estimate representing a degree of optimization.

The circuit optimizer 3 selects respective parts of the circuit, which should be subjected to equivalent circuit conversion during the optimization of the circuit (i.e., partial circuits), responsive to the estimate supplied from the calculator 2. Then, the optimizer 3 determines one by one whether or not each of these partial circuits should be actually converted into their associated equivalent circuits, thereby optimizing the overall circuit.

Next, the equivalent circuit converter 1A will be described in greater detail.

Figure 2:
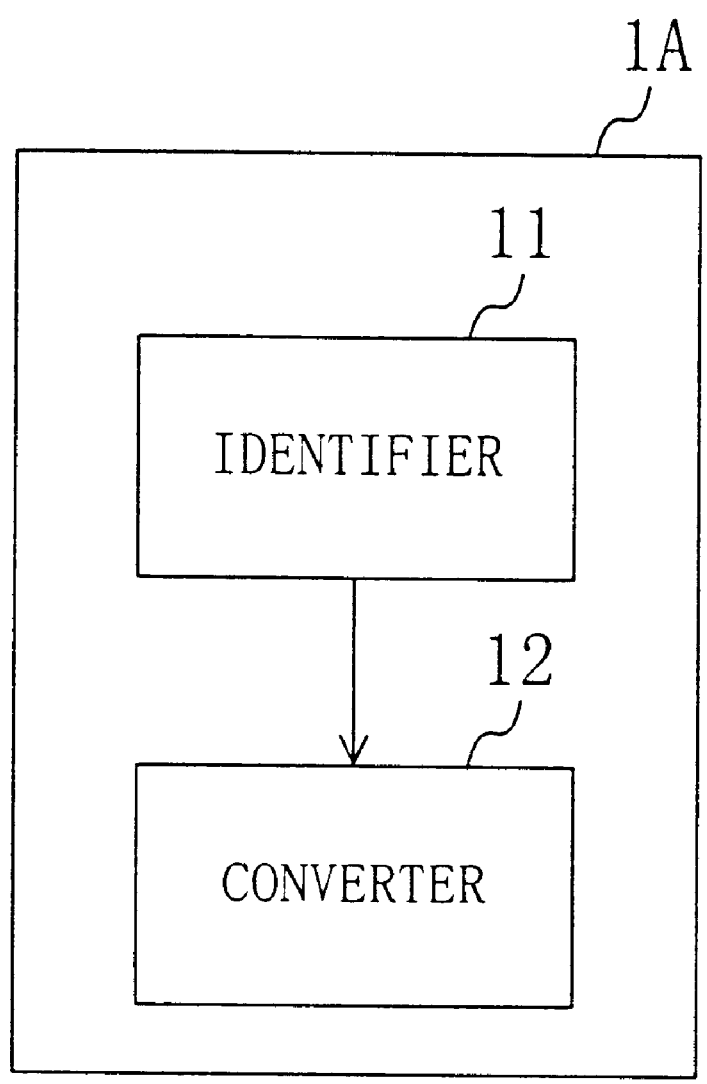
FIG. 2 is a functional block diagram of an equivalent circuit converter in the circuit optimization system of the first embodiment.

As shown in FIG. 2, the equivalent circuit converter 1A includes: an identifier 11; and a converter 12. The identifier 11 is supplied with the circuit diagram data D1 and equivalency conversion rule data D2 about the circuit to be synthesized. In response to these data D1 and D2, the identifier 11 identifies a partial circuit, which complies with the equivalency conversion rule data D2 and can be converted into an equivalent circuit thereof, from the circuit diagram data D1. Then, the converter 12 converts the partial circuit, which has been identified by the identifier 11 as convertible, into an equivalent circuit having a function equivalent to that of the partial circuit.

The identifier 11 searches for at least two partial circuits, which comply with the equivalency conversion rule data D2 and can be subjected to equivalency conversion, and then selects one of them. And the converter 12 converts the selected partial circuit into an equivalent circuit thereof. The target circuit may be retrieved by looking for a transistor connected to power line, ground line or clock line.

Next, exemplary equivalency conversion rule data D2 will be described.

Figure 3A:
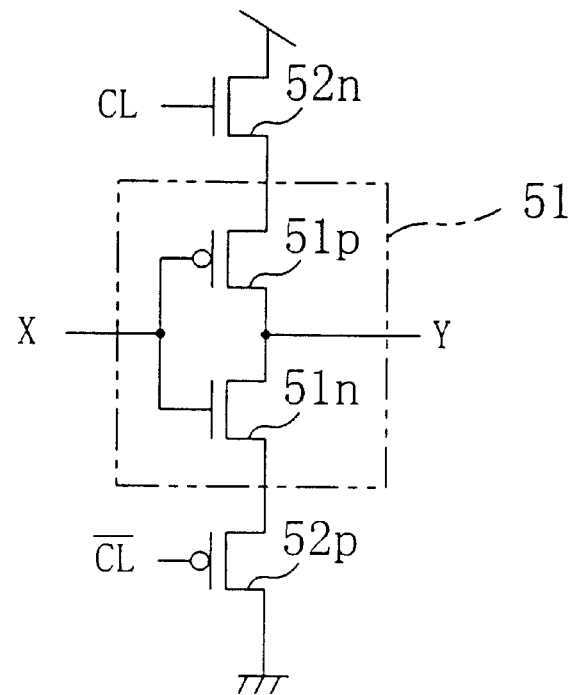
FIGS. 3(a) and 3(b) are circuit diagrams of respective partial circuits used for illustrating an equivalency conversion rule in the circuit optimization system of the first embodiment.

FIGS. 3(a) through 5(b) illustrate the circuit configurations of respective partial circuits for exemplifying an equivalency conversion rule in the first embodiment. A partial circuit shown in FIG. 3(a) is a dynamic circuit of a totem pole configuration. The partial circuit includes an inverter 51 consisting of first p-type transistor 51p and first n-type transistor 51n, the gates and the drains of which are connected to an input terminal X and output terminal Y, respectively. The inverter 51 is connected to a second n-type transistor 52n, which is controlled with a clock signal CL, at one end thereof closer to a power supply terminal. The inverter 51 is also connected to a second p-type transistor 52p, which is controlled with a clock complementary signal /CL, at the other end thereof closer to a ground terminal. Accordingly, while the clock signal CL is low, the impedance at the output terminal Y is high. On the other hand, while the clock signal CL is high, the inverter 51 is operative. The partial circuit shown in FIG. 3(b) is an equivalent circuit of the circuit shown in FIG. 3(a). As shown in FIG. 3(b), a selector 53, implemented as a transfer gate controlled by the clock signal CL and the clock complementary signal /CL, is connected to the output terminal of the inverter 51.

Figure 3B:
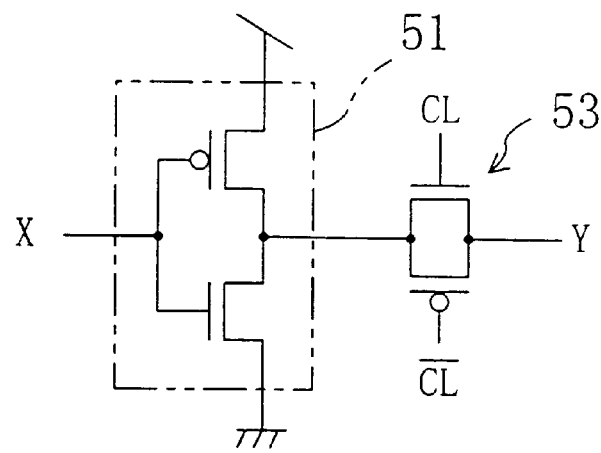

The partial circuit shown in FIG. 3(a) is advantageous in that output load capacitance can be suppressed, but is disadvantageous in that the power supply voltage cannot be low and the resistance of the serially connected transistors is high during operation, because the number of these transistors is large. On the other hand, the partial circuit shown in FIG. 3(b) is advantageous in that the power supply voltage can be reduced and the resistance of the serially connected transistors is low during operation, since the number of transistors is small. But the partial circuit shown in FIG. 3(b) is disadvantageous in that output load capacitance thereof increases. Accordingly, it greatly depends on the power supply voltage during operation and the manufacturing process technology which of these two types is more advantageous.

The partial circuit shown in FIG. 3(b) may be retrieved by performing the following processing steps:

Step 1—extracting all of the transistors receiving the clock signal at the respective gates thereof;

Step 2—retrieving pairs of transistors, each sharing source and drain in common, one by one from the transistors extracted in Step 1;

Step 3—connecting together respective pairs of transistors, each of which has been retrieved in Step 2 and shares source and drain in common, to form a plurality of transistor pairs;

Step 4—extracting some of the transistor pairs formed in Step 3, each of which pair includes p-type and n-type transistors receiving a signal and a complementary signal thereof at the respective gates thereof; and Step 5—extracting a transistor pair, the source or drain of which is connected to the output terminal of the inverter, from the transistor pairs extracted in Step 4.

As can be understood, the transistor pair and the inverter extracted in Step 5 correspond to the selector 53 and the inverter 51 shown in FIG. 3(b), respectively. That is to say, the desired circuit has been retrieved in this manner.

Figure 4A:
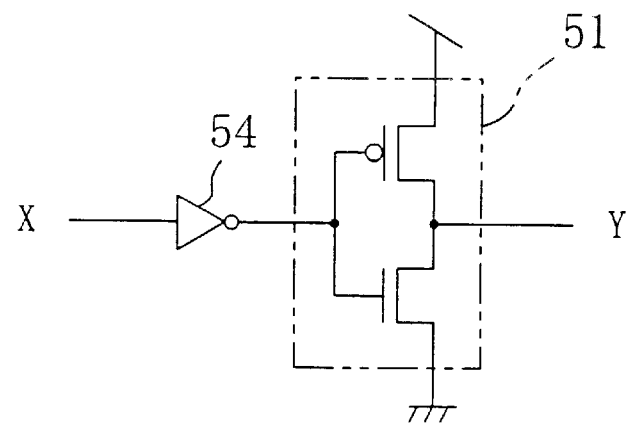
FIGS. 4(a) and 4(b) are circuit diagrams of respective partial circuits used for illustrating the equivalency conversion rule in the circuit optimization system of the first embodiment.
Figure 4B:
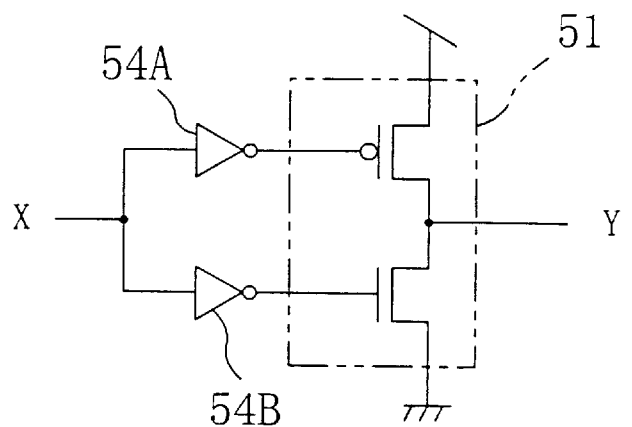

In the partial circuits shown in FIGS. 4(a) and 4(b), other inverter(s) for inverting the logical state of a signal supplied to the inverter 51 is/are connected to the inverter 51. Specifically, in the partial circuit shown in FIG. 4(a), an inverter 54 is provided between the input terminal x and the inverter 51. On the other hand, the partial circuit shown in FIG. 4(b) is an equivalent circuit of the partial circuit shown in FIG. 4(a), and is provided with two inverters 54A and 54B between the input terminal X and the inverter 51. The partial circuit shown in FIG. 4(a) is advantageous in speed and area because of a simpler configuration. On the other hand, the partial circuit shown in FIG. 4(b) can be optimized to reduce the feedthrough current during signal level transition. This is because opening/closing of the gates can be timed by adjusting a P/N ratio, i.e., a ratio of the size of a p-type transistor to that of an n-type transistor, in each of the two inverters 54A and 54B.

Figure 5A:
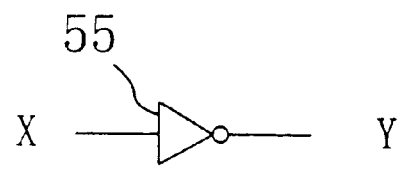
FIGS. 5(a) and 5(b) are circuit diagrams of respective partial circuits used for illustrating the equivalency conversion rule in the circuit optimization system of the first embodiment.
Figure 5B:
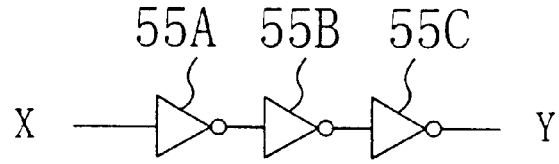

The partial circuit shown in FIG. 5(a) includes only one inverter 55, while the partial circuit shown in FIG. 5(b) includes a serial connection of first, second and third inverters 55A, 55B and 55C. The partial circuits shown in FIGS. 5(a) and 5(b) are logically equivalent to each other. However, in the partial circuit shown in FIG. 5(a), although the area thereof may be smaller, it is hard to ensure a high drivability. Conversely, in the partial circuit shown in FIG. 5(b), although the area thereof is larger, a sufficiently high drivability can be attained.

As can be understood, all of these partial circuits and the equivalent circuits thereof have their own advantages and disadvantages. Accordingly, an optimum circuit may be selected depending on the process technology associated with the circuit to be synthesized.

Next, the estimate calculator 2 will be described in greater detail. The estimate calculator 2 calculates an estimate representing a degree of optimization for a transistor-level circuit using the circuit diagram data D1 thereof.

Figure 6:
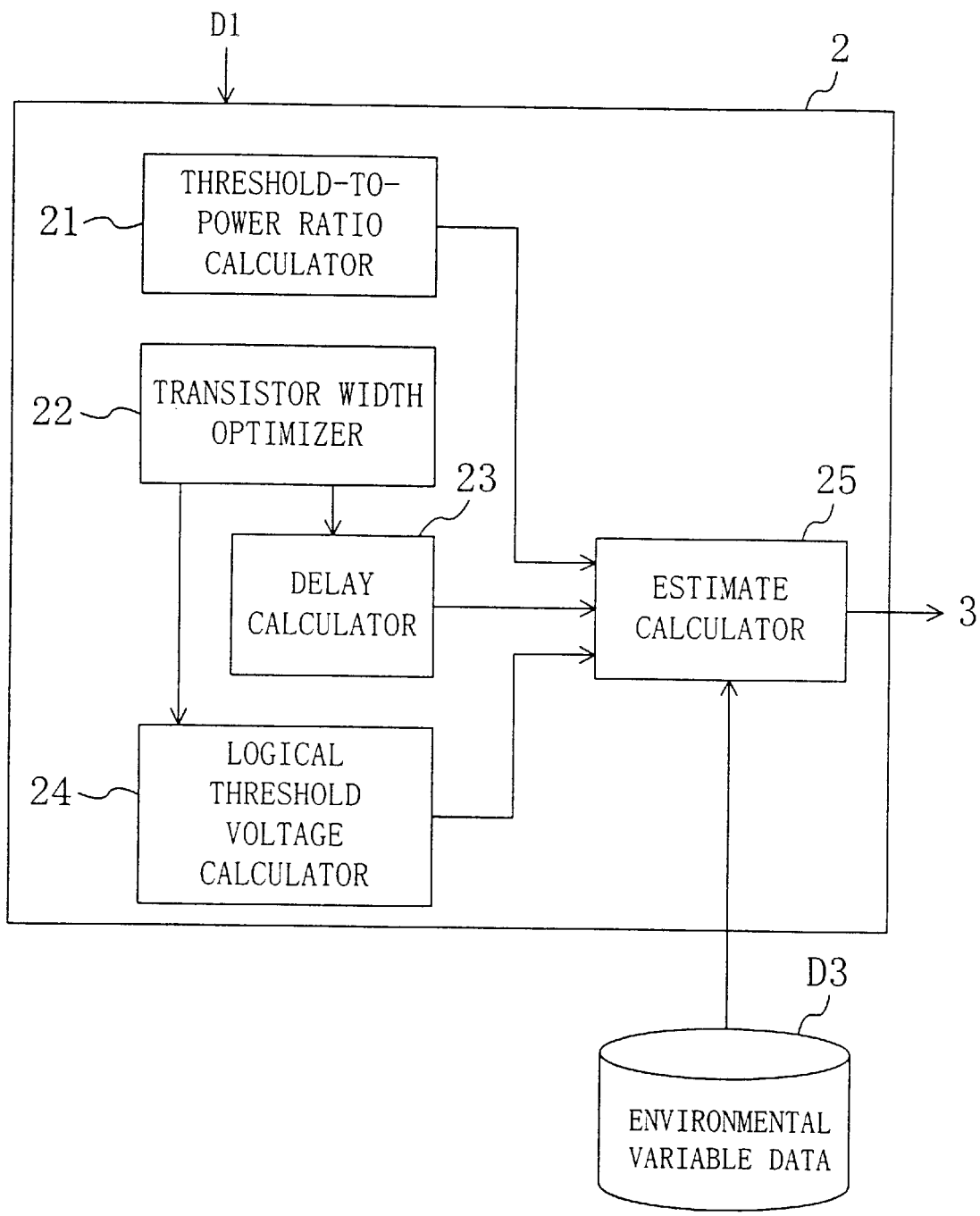
FIG. 6 is a functional block diagram of a circuit optimizer in the circuit optimization system of the first embodiment.

As shown in FIG. 6, the estimate calculator 2 includes: a threshold-to-power ratio calculator 21; a transistor width optimizer 22; a delay calculator 23; a logical threshold voltage calculator 24; and an estimate calculator 25. The threshold-to-power ratio calculator 22 calculates a ratio of the sum of the threshold voltages of respective serially connected transistors included in a partial circuit to a power supply voltage. The transistor width optimizer 22 optimizes the widths of a plurality of transistors included in a partial circuit. The delay calculator 23 calculates the delay time of the partial circuit. The logical threshold voltage calculator 24 calculates a logical threshold voltage, which is a voltage when output logical states are inverted at a gate. And the estimate calculator 25 calculates the estimate by weighting respective results derived by the threshold-to-power ratio calculator 21, the delay calculator 23 and the logical threshold voltage calculator 24 in accordance with the environmental variable data D3.

In this embodiment, the transistor width optimizer 22 can obtain optimum transistor widths in accordance with the method disclosed in the above-identified Japanese Laid-Open Publication No. 11-3973, for example.

Next, a specific example of an estimate function obtained by the threshold-to-power ratio calculator 21 and the logical threshold voltage calculator 24 will be described.

First, suppose a power supply voltage Vdd is 1.8 V and the largest number of transistors serially connectable is N, which is a natural number, in the threshold-to-power ratio calculator 21. Then, a ratio of the sum of threshold voltages of respective transistors to the power supply voltage as represented by the following Equation (1) may be used as an estimate ensuring the operability with respect to the power supply voltage:

$$N \cdot Vt/(Vdd - \alpha) \tag{1}$$

where $\alpha$ is a variable representing a variation in power supply voltage depending on the process and the circuit layout design. In this case, the value obtained by Equation (1) has a permissible range from 0 to 1. As the value is closer to 1, it is more and more difficult to ensure the operability.

An estimate function Ev is suitably obtained using the estimate represented by Equation (1) based on the following Equation (2):

$$Ev = 1/\{\max(\delta, 1 - N \cdot Vt/(Vdd - \alpha)\} \tag{2}$$

where $\delta$ is a positive number and $\delta \ll 1$. In this case, if the value derived by Equation (1) is 0, then the first estimate function Ev is 1. On the other hand, if the value derived by Equation (1) is close to, or exceeds, 1, then the first estimate function Ev is infinity.

Next, the input voltage (logical threshold voltage) Vth when the output logical states at the gate are inverted in the logical threshold voltage calculator 24 is preferably approximately half of the power supply voltage Vdd, i.e., a median of the power supply voltage Vdd. The logical threshold voltage Vth can be derived by analyzing the circuit using various circuit constants thereof.

The second estimate function Et where the logical threshold voltage Vth is preferably a median of the power supply voltage Vdd is represented by the following Equation (3):

$$Et = \max(1/(Vdd - Vth), 1/Vth) \tag{3}$$

Also, the estimate calculator 25 calculates the estimate representing a degree of circuit optimization as a weighted linear sum of the first and second estimate functions Ev and Et by the following Equation (4):

$$Etotal = A \cdot Ev + B \cdot Ev \tag{4}$$

In this case, variables depending on external environment are the variable $\alpha$ of Equation (1) and the variables A and B of Equation (4). For example, if the design rule employed in a process has been drastically reduced and designing variation happens more frequently in the process, then the variable $\alpha$ should be increased. On the other hand, if the number of serially connected transistors should be reduced with respect to the same power supply voltage, then the variable A should be increased. By performing these operations, an optimized standard can be set in response to the modification or variation in external environment and can be reflected on the evaluated degree of optimization of a circuit.

Hereinafter, the operation of the circuit optimization system having such a configuration will be described with reference to the accompanying drawings. The equivalent circuit converter 1A, the estimate calculator 2 and the circuit optimizer 3 may be implemented as respective software programs run by a computer system. In the following exemplary operation, the circuit optimizer 3 shown in Figure serves as a main program and the other components, i.e., the equivalent circuit converter 1A and the estimate calculator 2, function as subsidiary components in optimizing the target circuit.

Figure 7:
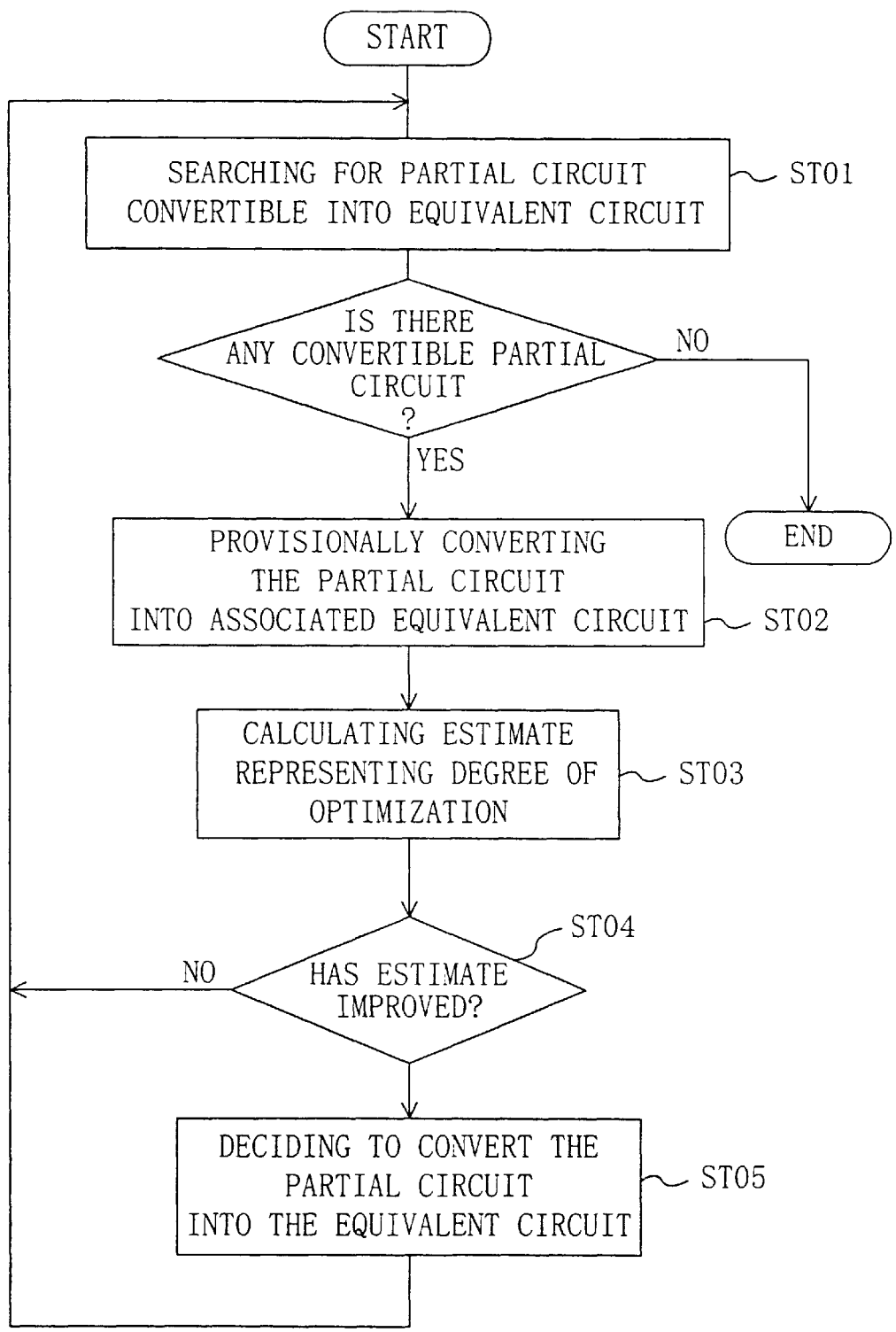
FIG. 7 is a flowchart illustrating the optimization procedure performed by the circuit optimization system of the first embodiment.

FIG. 7 is a flowchart illustrating the procedure of optimization performed by the circuit optimization system of the first embodiment. As shown in FIG. 7, first, in Step ST01, the equivalent circuit converter 1A searches for a partial circuit, which is convertible into an associated equivalent circuit thereof, from the entire circuit to be optimized. If such a partial circuit, convertible into an equivalent circuit thereof, has not been found, then the processing ends.

Next, in Step ST02, the equivalent circuit converter 1A provisionally converts the retrieved partial circuit into an associated equivalent circuit thereof.

Then, in Step ST03, the estimate calculator 2 reads out the circuit diagram data D1 and the environmental variable data D3 and calculates an estimate representing a degree of optimization using the estimate function Etotal given by Equation (4).

Subsequently, in Step ST04, the circuit optimizer 3 determines whether or not the estimate has improved as compared with the value before the partial circuit was converted into the equivalent circuit thereof. If the estimate has not improved as a result of this provisional conversion, then the conversion is aborted.

Alternatively, if the estimate has improved through this provisional conversion, then the circuit optimizer 3 decides to convert the partial circuit into the equivalent circuit thereof in Step ST05. And then a next partial circuit is searched for.

Next, a specific example of a circuit to be converted by such circuit optimization processing will be described with reference to the accompanying drawings.

Figure 8:
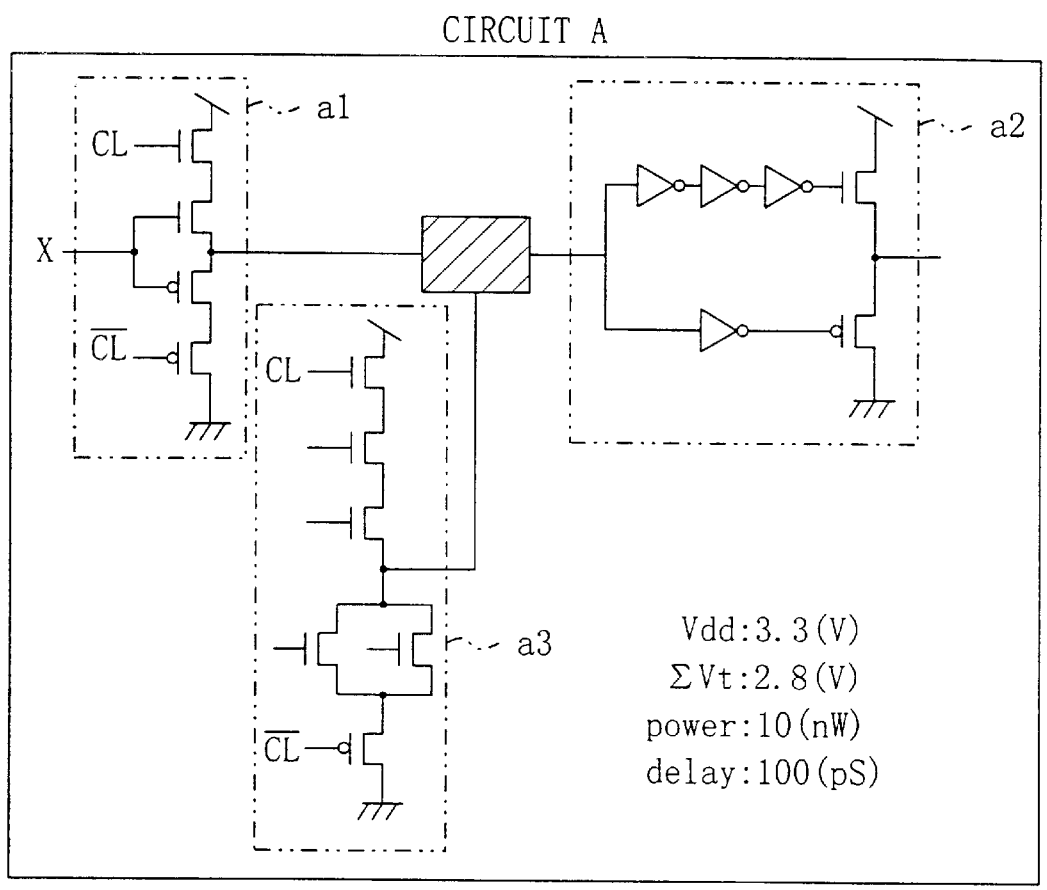
FIG. 8 is a circuit diagram illustrating a circuit, which should be optimized through the circuit optimization processing using the circuit optimization system of the first embodiment and which is still compatible with conventional process technology.
Figure 9:
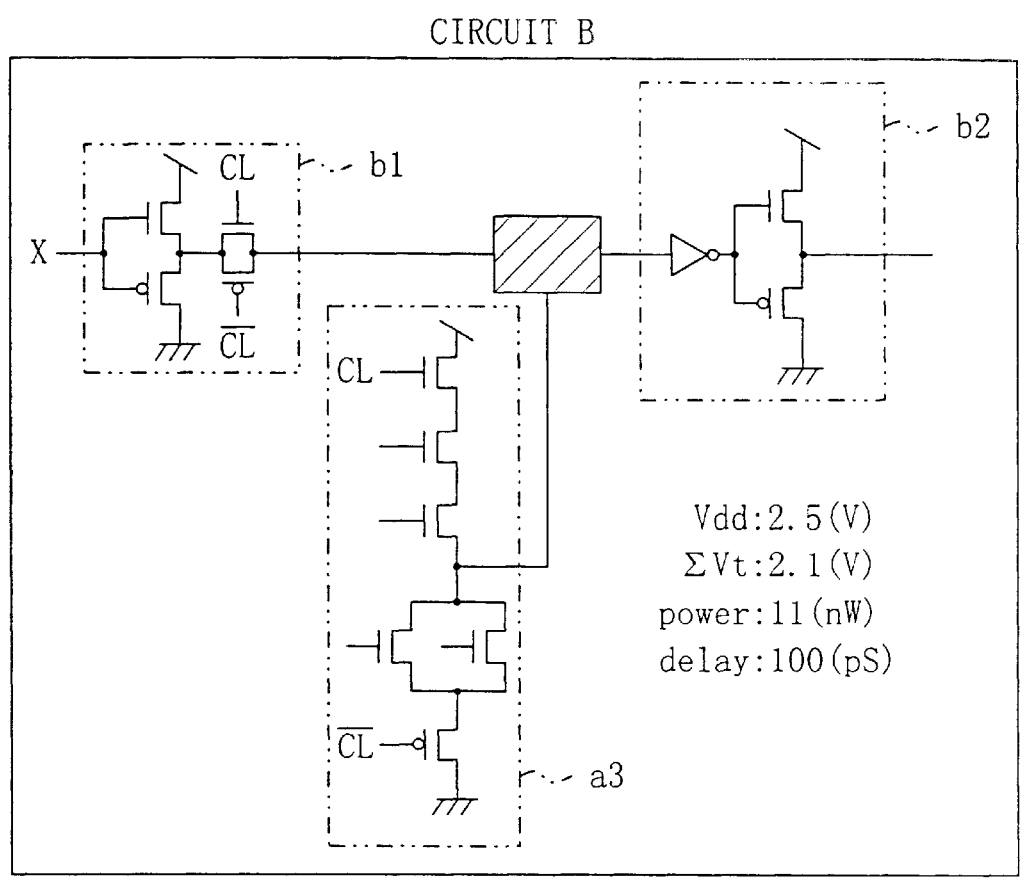
FIG. 9 is a circuit diagram illustrating an equivalency-converted circuit, which has now established compatibility with new process technology by modifying the circuit shown in FIG. 8 through the circuit optimization processing using the circuit optimization system of the first embodiment.
Figure 10:
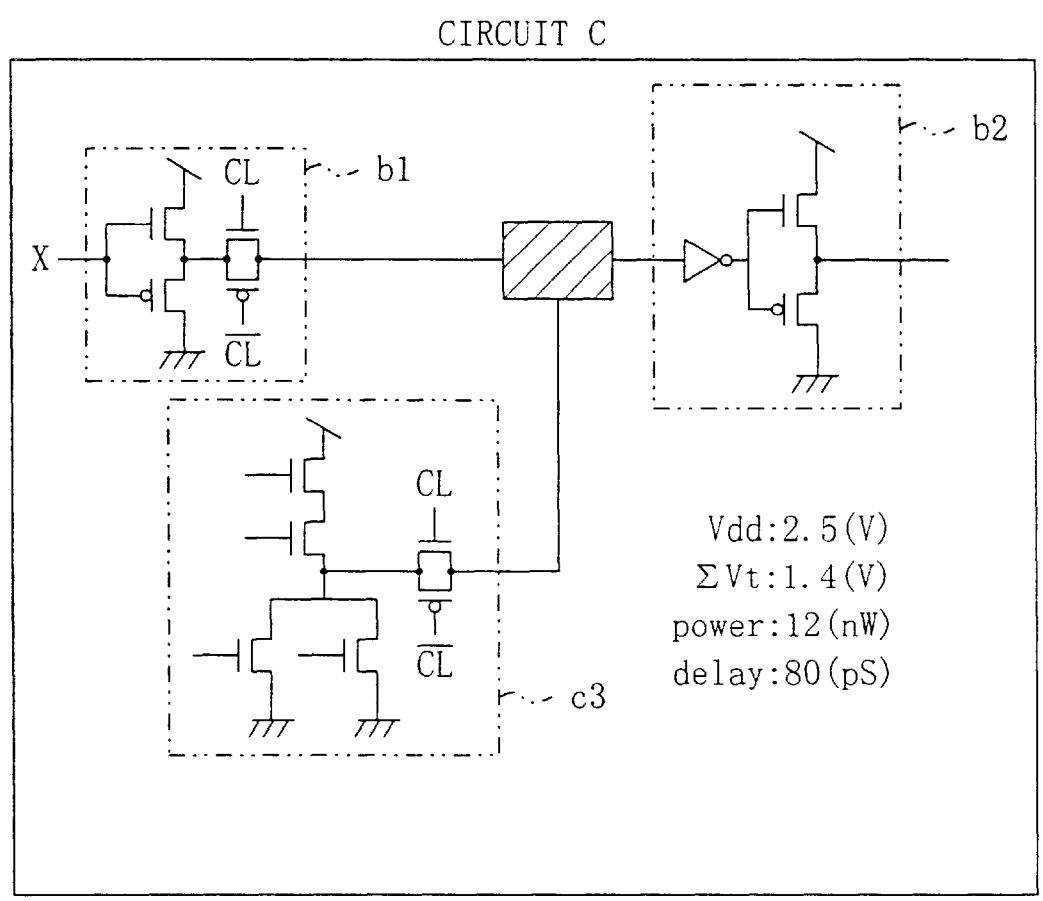
FIG. 10 is a circuit diagram illustrating another equivalency-converted circuit, which has now established compatibility with new process technology by further modifying the circuit shown in FIG. 8 through the circuit optimization processing using the circuit optimization system of the first embodiment.

FIGS. 8 through 10 are circuit diagrams illustrating step by step how the circuit optimization processing is carried out in this embodiment. A circuit A shown in FIG. 8 has a configuration including first, second and third partial circuits a1, a2 and a3, which are all compatible with a conventional manufacturing process. For example, suppose the power supply voltage Vdd supplied to the circuit A has been reduced from 3.3 V to 2.5 V as a result of the modification in process technology. Since the power supply voltage Vdd has been reduced, the ratio of the sum of threshold voltages of serially connected transistors to the power supply voltage Vdd should also be reduced. In addition, since the power supply voltage Vdd has been reduced, the power consumed by the entire circuit decreases. Accordingly, in such a case, increasing the operating speeds of respective transistors is more desirable than reducing the power consumption of respective transistors. Thus, if the first partial circuit a1 in the circuit A shown in FIG. 8 is converted into an alternate first partial circuit b1 in a circuit B shown in FIG. 9, then the sum of threshold voltages in the first partial circuit b1 is smaller than that of the counterpart a1 as described referring to FIGS. 3($a$) and 3($b$).

Also, if the second partial circuit a2 in the circuit A shown in FIG. 8 is converted into an alternate second partial circuit b2 in the circuit B shown in FIG. 9, then the second partial circuit b2 can be driven at a voltage lower than that of the counterpart a2 as described referring to FIGS. 5($a$) and 5($b$).

Furthermore, if the third partial circuit a3 in the circuit B shown in FIG. 9 is converted into an alternate third partial circuit c3 in a circuit C shown in FIG. 10, then the sum of the threshold voltages in the third partial circuit c3 is smaller than that of the third partial circuit a3.

As can be understood, by converting the circuit A into the circuit B and then into the circuit C, the compatibility with the process technology can be improved step by step.

If the present invention is implemented as an expert system, for example, then the equivalency conversion relationship among circuits A, B and C should be described as knowledge representations as shown in FIG. 11. In FIG. 11, the structures should be accumulated as a circuit equivalency conversion knowledge base or circuit structure database.

Embodiment 2

Hereinafter, the second embodiment of the present invention will be described with reference to the accompanying drawings.

Figure 12:
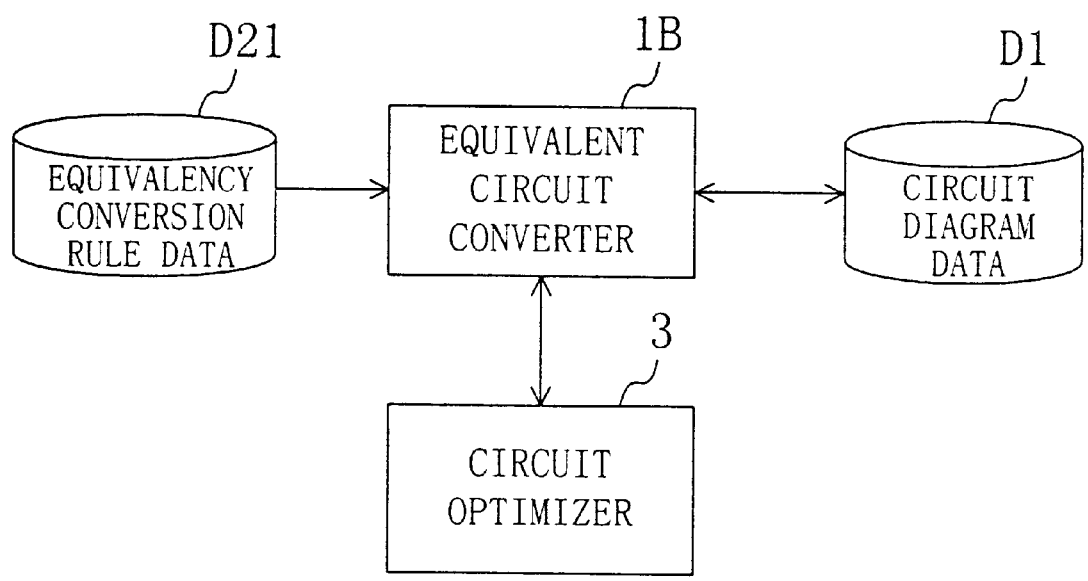
FIG. 12 is a functional block diagram of a circuit optimization system according to the second embodiment of the present invention.

FIG. 12 illustrates functional blocks of a circuit optimization system of the second embodiment. In FIG. 12, the same components as those shown in FIG. 1 are identified by the same reference numerals and the description thereof will be omitted herein. Equivalency conversion rule data D21 shown in FIG. 12 is composed of only one-directional conversion rules. Specifically, as soon as the equivalent circuit converter 1B has found a partial circuit, which is convertible into an associated equivalent circuit thereof, based on the equivalency conversion rule data D21 read out, the converter 1B performs the conversion one by one. And at a point in time when no convertible partial circuit can be found any longer, the circuit synthesis ends. The "one-directional" conversion herein means a conversion rule allowing, for example, only a conversion from the inverter 55 shown in FIG. 5(a) into the inverters 55A, 55B and 55C shown in FIG. 5(b) or vice versa.

By using the equivalency conversion rule data D21 compatible with desired process conditions, power supply voltage or the like in this manner, an optimized circuit can be re-synthesized quickly and easily.

Embodiment 3

Hereinafter, the third embodiment of the present invention will be described with reference to the accompanying drawings.

Figure 13:
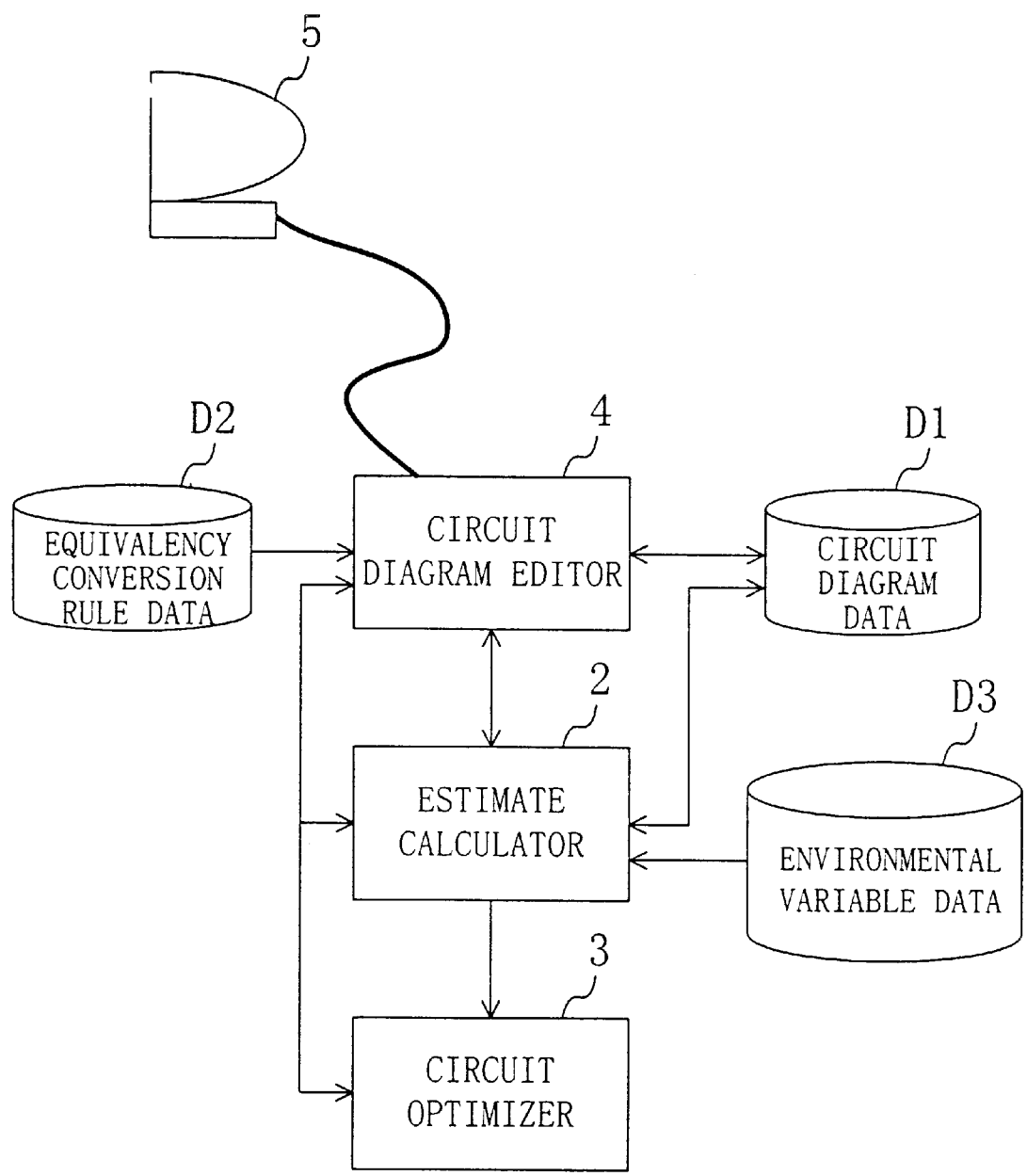
FIG. 13 is a functional block diagram of a circuit optimization system according to the third embodiment of the present invention.

FIG. 13 illustrates functional blocks of a circuit optimization system of the third embodiment. In FIG. 13, the same components as those shown in FIG. 1 are identified by the same reference numerals and the description thereof will be omitted herein. The circuit optimization system of the third embodiment includes a component that can interactively convert a partial circuit into an associated equivalent circuit thereof based on transistor-level circuit data. As shown in FIG. 13, the circuit optimization system includes a circuit diagram editor 4, i.e., an exemplary circuit editor, with an interactive input/output device 5, which serves as both input and display sections.

The operation of the circuit optimization system having such a configuration will be described. First, the operator of this system activates the circuit diagram editor 4 through the interactive input/output device 5 and performs predetermined operations, thereby reading out the circuit diagram data D1 about a circuit including a plurality of partial circuits. Then, a desired partial circuit is selected from the circuit diagram data D1 read out, and is converted following the equivalency conversion rule data D2. After the results of conversion have been fed back to the circuit diagram data D1, the estimate calculator 2 derives the estimate Etotal of the converted equivalent circuit in accordance with Equation (4), and then outputs the estimate Etotal derived to the circuit diagram editor 4 and the circuit optimizer 3.

Accordingly, in this embodiment, if a circuit has been modified, then the estimate of the modified circuit is displayed instantaneously. That is to say, the operator can perform optimized conversion processing while checking the estimate. As a result, artificial errors by the operator can be prevented and the circuit optimization can be performed more efficiently during circuit synthesis.

What is claimed is:

1. A circuit optimization system for optimizing a transistor-level circuit, including a plurality of partial circuits, to comply with process technology associated with the circuit, each said partial circuit including a plurality of transistors, the system comprising:

equivalent circuit converting means for provisionally converting at least one of the partial circuits, which complies with an equivalency conversion rule of the circuit, into an equivalent circuit having a function equivalent to that of the partial circuit;

estimate calculating means for calculating an estimate representing a degree of compatibility of the equivalent circuit with the process technology; and circuit optimizing means for evaluating the estimate derived by the calculating means and deciding that the partial circuit should be converted into the equivalent circuit if the estimate has improved.

2. The system of claim 1, wherein the converting means comprises:

an identifier for identifying at least one partial circuit, which is convertible into an associated equivalent circuit thereof, from the partial circuits; and a converter for converting the partial circuit, which has been identified as convertible by the identifier, into the associated equivalent circuit thereof.

3. The system of claim 1, wherein the calculating means comprises:

a threshold-to-power ratio calculator for calculating a ratio of the sum of respective threshold voltages of a plurality of serially connected transistors, included in a partial circuit, to a power supply voltage;

a delay calculator for calculating a delay time of the partial circuit;

a logical threshold voltage calculator for calculating a logical threshold voltage, which is a voltage when output logical states are inverted at a gate; and an estimate calculator for calculating the estimate by weighting respective results derived by the threshold-to-power ratio calculator, the delay calculator and the logical threshold voltage calculator in accordance with the process technology.

4. The system of claim 3, wherein the calculating means further comprises a transistor width optimizer for optimizing the widths of a plurality of transistors and outputting the optimized transistor widths to the delay calculator and the logical threshold voltage calculator.

5. A circuit optimization system for optimizing a transistor-level circuit including a plurality of partial circuits, each said partial circuit including a plurality of transistors, wherein the system comprises circuit optimization means for optimizing the circuit by converting each said partial circuit into an associated equivalent circuit thereof having a function equivalent to that of the partial circuit in accordance with an equivalency conversion rule of the circuit.

6. A circuit optimization system for optimizing a transistor-level circuit to comply with process technology associated with the circuit, the system comprising:

circuit editing means, provided with an input/output section, for interactively modifying the circuit in accordance with an equivalency conversion rule of the circuit;

estimate calculating means for calculating an estimate to optimize the circuit modified by the circuit editing means in accordance with the process technology; and display means for displaying the estimate derived by the calculating means thereon.

7. The system of claim 6, wherein the calculating means comprises:

a threshold-to-power ratio calculator for calculating a ratio of the sum of respective threshold voltages of a plurality of serially connected transistors, included in a partial circuit, to a power supply voltage;

a delay calculator for calculating a delay time of the partial circuit;

a logical threshold voltage calculator for calculating a logical threshold voltage, which is a voltage when output logical states are inverted at a gate; and an estimate calculator for calculating the estimate by weighting respective results derived by the threshold-to-power ratio calculator, the delay calculator and the logical threshold voltage calculator in accordance with the process technology.

8. The system of claim 7, wherein the calculating means further comprises a transistor width optimizer for optimizing the widths of a plurality of transistors and outputting the optimized transistor widths to the delay calculator and the logical threshold voltage calculator.

* * * * *